US012606933B2

(12) United States Patent
Miyashita et al.

(10) Patent No.: US 12,606,933 B2
(45) Date of Patent: Apr. 21, 2026

(54) METHOD FOR MANUFACTURING EPITAXIAL SUBSTRATE BY IRRADIATING A SURFACE OF A GROUP III NITRIDE SEMICONDUCTOR LAYER WITH ULTRAVIOLET LIGHT IN AN ATMOSPHERE CONTAINING OXYGEN

(71) Applicants: Sumitomo Electric Device Innovations, Inc., Yokohama (JP); Sumitomo Electric Industries, Ltd., Osaka (JP)

(72) Inventors: Kohei Miyashita, Yokohama (JP); Takeshi Kishi, Yokohama (JP); Takumi Yonemura, Osaka (JP)

(73) Assignees: Sumitomo Electric Device Innovations, Inc., Yokohama (JP); Sumitomo Electric Industries, Ltd., Osaka (JP)

( * ) Notice: Subject to any disclaimer, the term of this patent is extended or adjusted under 35 U.S.C. 154(b) by 553 days.

(21) Appl. No.: 17/771,875

(22) PCT Filed: Nov. 4, 2020

(86) PCT No.: PCT/JP2020/041244
§ 371 (c)(1),
(2) Date: Apr. 26, 2022

(87) PCT Pub. No.: WO2021/090848
PCT Pub. Date: May 14, 2021

(65) Prior Publication Data
US 2023/0005736 A1 Jan. 5, 2023

(30) Foreign Application Priority Data
Nov. 5, 2019 (JP) ................................. 2019-200738

(51) Int. Cl.
*C30B 33/00* (2006.01)
*C30B 25/02* (2006.01)
(Continued)

(52) U.S. Cl.
CPC ........... *C30B 29/406* (2013.01); *C30B 25/02* (2013.01); *C30B 29/403* (2013.01); *C30B 33/00* (2013.01);
(Continued)

(58) Field of Classification Search
CPC ......... C30B 25/00; C30B 25/02; C30B 25/16; C30B 25/18; C30B 25/183; C30B 25/186;
(Continued)

(56) References Cited

U.S. PATENT DOCUMENTS 8,852,965 B2 10/2014 Fujikane et al.
2005/0221545 A1* 10/2005 Kokubo ............ H01L 21/02381
438/164
(Continued)

FOREIGN PATENT DOCUMENTS

JP 2000-306854 A 11/2000
JP 2009010216 A * 1/2009
(Continued)

*Primary Examiner* — Kenneth A Bratland, Jr.
(74) *Attorney, Agent, or Firm* — Volpe Koenig

(57) ABSTRACT
A method for manufacturing an epitaxial substrate includes the steps of: epitaxially growing a group III nitride semiconductor layer on a substrate; removing the substrate from a growth furnace; irradiating a surface of the group III nitride semiconductor layer with ultraviolet light while exposing the surface to an atmosphere containing oxygen; and measuring a sheet resistance value of the group III nitride semiconductor layer.

7 Claims, 21 Drawing Sheets

(51) Int. Cl.

| | |
|---|---|
| *C30B 29/40* | (2006.01) |
| *H10D 62/85* | (2025.01) |
| *H10P 14/20* | (2026.01) |
| *H10P 74/20* | (2026.01) |
| *H10D 30/47* | (2025.01) |

(52) U.S. Cl.
CPC ......... *H10D 62/8503* (2025.01); *H10P 14/20* (2026.01); *H10P 14/2904* (2026.01); *H10P 14/3248* (2026.01); *H10P 14/3434* (2026.01); *H10P 74/207* (2026.01); *H10D 30/475* (2025.01); *H10P 14/3416* (2026.01); *H10P 14/38* (2026.01)

(58) Field of Classification Search
CPC ......... C30B 29/00; C30B 29/10; C30B 29/40; C30B 29/403; C30B 29/406; C30B 33/00; C30B 33/02; H01L 21/02378; H01L 21/02502; H01L 21/02565; H01L 21/02612; H01L 21/0254; H01L 21/02664; H01L 22/14; H01L 29/2003; H01L 29/7786

USPC ......... 117/7, 9, 84, 88–90, 92, 94, 103, 105, 117/937, 952
See application file for complete search history.

(56) References Cited

U.S. PATENT DOCUMENTS

| | | | |
|---|---|---|---|
| 2007/0296060 | A1 | 12/2007 | Tanabe et al. |
| 2013/0069075 | A1 | 3/2013 | Fujikura et al. |
| 2015/0140699 | A1* | 5/2015 | Kim .................. H01L 21/02664 |
| | | | 438/23 |
| 2016/0111342 | A1* | 4/2016 | Huang ................ C23C 14/5826 |
| | | | 156/345.24 |

FOREIGN PATENT DOCUMENTS

| | | | | |
|---|---|---|---|---|
| JP | 2012-178413 | A | | 9/2012 |
| JP | 2013-075815 | A | | 4/2013 |
| KR | 10-2005-0123422 | A | | 12/2005 |
| KR | 20050123422 | A | * | 12/2009 |
| WO | 2006/013846 | A1 | | 2/2006 |
| WO | 2013/014713 | A1 | | 1/2013 |

* cited by examiner

DISTANCE FROM SURFACE [μm]

METHOD FOR MANUFACTURING EPITAXIAL SUBSTRATE BY IRRADIATING A SURFACE OF A GROUP III NITRIDE SEMICONDUCTOR LAYER WITH ULTRAVIOLET LIGHT IN AN ATMOSPHERE CONTAINING OXYGEN

TECHNICAL FIELD

The present disclosure relates to a method for manufacturing an epitaxial substrate and an epitaxial substrate.

This application claims priority based on Japanese Patent Application No. 2019-200738, filed on Nov. 5, 2019, the entire contents of the Japanese Patent Application are incorporated herein by reference.

BACKGROUND ART

Patent Literature 1 discloses a method for activating a p-type layer included in a gallium nitride-based compound semiconductor device. In this method, the p-type layer is irradiated with light having a wavelength within a range from ultraviolet light to visible light at a temperature of 200° C. or more and 500° C. or less. As a result, hydrogen bonded to the p-type dopant contained in the p-type layer is separated and removed, and activation of the p-type dopant as an acceptor is promoted.

CITATION LIST

Patent Literature

Patent Literature 1: Japanese Unexamined Patent Application Publication No. 2000-306854
Patent Literature 2: International Publication WO 2006/013846

SUMMARY OF INVENTION

A method for manufacturing an epitaxial substrate according to an embodiment of the present disclosure includes the steps of: epitaxially growing a group III nitride semiconductor layer on a substrate; removing the substrate from a growth furnace; irradiating a surface of the group III nitride semiconductor layer with ultraviolet light while exposing the surface to an atmosphere containing oxygen; and measuring a sheet resistance value of the group III nitride semiconductor layer.

An epitaxial substrate according to an embodiment of the present disclosure includes a channel layer, a barrier layer, and a capping layer. The channel layer is disposed on a main surface of a substrate. The barrier layer is disposed on the channel layer and has a composition represented by $Al_yGa_{1-y}N$ (where $0<y<0.4$). The capping layer is disposed on the barrier layer. A group III nitride semiconductor layer consisting of the channel layer, the barrier layer, and the capping layer has a sheet resistance value of 300 ($\Omega$/sq.) to 800 ($\Omega$/sq.) in the epitaxial substrate.

DESCRIPTION OF EMBODIMENTS

Figure 1:
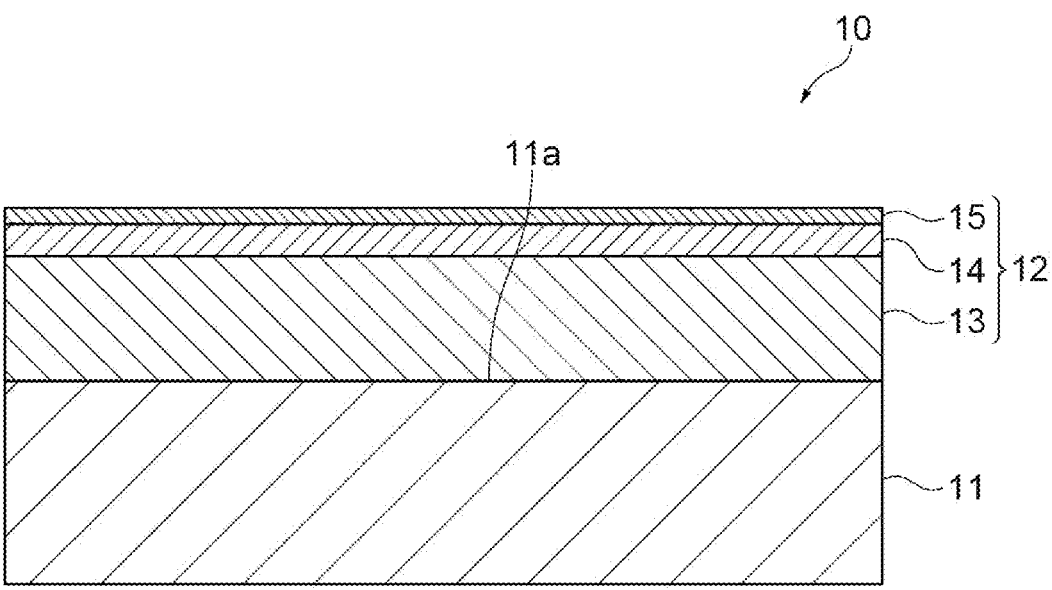
FIG. 1 is a diagram illustrating a cross-sectional structure of a substrate product including a nitride semiconductor layer used for measuring a sheet resistance value.

Problems to be Solved by Present Disclosure

Many group III nitride-based semiconductor devices include a semiconductor layer epitaxially grown on a substrate. In order to evaluate the performance of a semiconductor layer, it is effective to measure a sheet resistance value of the semiconductor layer. This is because the sheet resistance value correlates highly with the operation characteristics (e.g. the maximum forward drain current Ifmax)

of the semiconductor element. The sheet resistance value is measured by, for example, an eddy current method. In order to accurately evaluate the performance of a semiconductor device, it is desirable to accurately measure the sheet resistance value. However, when a semiconductor layer is grown and a substrate is taken out from a growth furnace, various substances contained in an environment outside the growth furnace are bonded to a group III atom (e.g. Ga). These substances gradually leave the group III atom, and instead an oxygen atom is bonded to the group III atom. Therefore, the degree of oxidation of the surface of the semiconductor layer is initially low and gradually increases with time. Since the sheet resistance value depends on the degree of oxidation of the surface of the semiconductor layer, in order to accurately measure the sheet resistance value of the semiconductor layer, it is necessary to take out the substrate on which the semiconductor layer has been grown to the outside of the growth furnace, then leave the semiconductor layer for a long time (empirically, about 48 hours), and measure the sheet resistance value after oxidation has sufficiently progressed and the sheet resistance value has stabilized. This leads to an increase in production lead time and a decrease in production efficiency.

Advantageous Effects of the Present Disclosure

According to the present disclosure, a sheet resistance value of an epitaxial substrate can be stabilized in a shorter time.

DESCRIPTION OF THE EMBODIMENTS OF THE PRESENT DISCLOSURE

First, embodiments of the present disclosure will be listed and described. A method for manufacturing an epitaxial substrate according to an embodiment of the present disclosure includes the steps of: epitaxially growing a group III nitride semiconductor layer on a substrate; removing the substrate from a growth furnace; irradiating a surface of the group III nitride semiconductor layer with ultraviolet light while exposing the surface to an atmosphere containing oxygen; and measuring a sheet resistance value of the group III nitride semiconductor layer.

When ultraviolet light is irradiated onto the surface of the group III nitride semiconductor layer while exposing the surface of the group III nitride semiconductor layer to an atmosphere containing oxygen, oxidation of the surface of the group III nitride semiconductor layer is accelerated as compared with a case where the substrate is left as it is. This is believed to be due to the following effects. When ultraviolet light is irradiated to the surface of the group III nitride semiconductor layer, the surface of the group III nitride semiconductor layer generates heat. The bonds between various substances contained in the environment outside the growth furnace and group III atoms are broken by this heat. Alternatively, various substances are oxidized into low-density substances. By these actions, various substances are desorbed from the group III nitride semiconductor layer. Immediately after that, oxygen atoms in the atmosphere are combined with group III atoms on the surface of the group III nitride semiconductor layer to oxidize the group III atoms. In this way, oxidation of the surface of the group III nitride semiconductor layer is accelerated, and the sheet resistance value can be stabilized in a shorter time. Therefore, the production lead time can be shortened and the production efficiency can be improved.

In the manufacturing method, the surface of the group III nitride semiconductor layer may contain Ga. In this case, upon irradiating ultraviolet light to the surface of the group III nitride semiconductor layer, Ga is changed to $GaO_x$ due to bonding of an oxygen atom to a Ga atom. Therefore, oxidation of the surface of the group III nitride semiconductor layer is accelerated, and the sheet resistance value can be stabilized in a shorter time.

In the manufacturing method, when a Gaussian function is fitted to a Ga 3d peak of the surface of the group III nitride semiconductor layer obtained by X-ray photoelectron spectroscopy after the surface is irradiated with ultraviolet light having a center wavelength of 320 nm to 330 nm, a ratio $(I_{GaO}/I_{GaN})$ of a GaO intensity $I_{GaO}$ to a GaN intensity $I_{GaN}$ may be 0.15 or more. According to the experience of the present inventors, when a group III nitride semiconductor layer is epitaxially grown on a substrate and then the substrate is taken out from a growth furnace and left to stand, the sheet resistance value is stabilized in about 48 hours. The ratio $(I_{GaO}/I_{GaN})$ indicating the degree of oxidization at that time is about 0.15. According to the measurement method, it is possible to accelerate the degree of oxidation of the group III nitride semiconductor layer to the same degree or more in a short time.

In the manufacturing method, the sheet resistance value of the group III nitride semiconductor layer may be measured within 0.2 hours after the substrate is removed from the growth furnace. As described above, according to the described measurement method, the sheet resistance value of the group III nitride semiconductor layer can be measured within an extremely short time after the substrate is taken out from the growth furnace, which can contribute to improvement in production efficiency.

In the manufacturing method, the ultraviolet light may have a center wavelength of 422 nm or less. In this case, bonds between the various substances and group III atoms are more rapidly broken by strong energy of ultraviolet light, and oxidation of the surface of the group III nitride semiconductor layer can be more effectively accelerated. The ultraviolet light may be, for example, He—Cd laser light. In this case, ultraviolet light UV having a center wavelength in the range from 190 nm to 422 nm can be emitted.

In the manufacturing method, an irradiation energy density in the step of irradiating the surface with the ultraviolet light may be 2.4 W·s/m² or more. The irradiation energy density is a product of an intensity and an irradiation time of the ultraviolet light. In this case, oxidation of the surface of the group III nitride semiconductor layer is further accelerated, and the sheet resistance value can be stabilized in a shorter time.

The manufacturing method may further include a step of forming an insulating film on a Ga surface of the group III nitride semiconductor layer. In this case, the Ga surface is stabilized, and the sheet resistivity can be stabilized early.

An epitaxial substrate according to an embodiment of the present disclosure includes a channel layer, a barrier layer, and a capping layer. The channel layer is disposed on a main surface of a substrate. The barrier layer is disposed on the channel layer and has a composition represented by $Al_yGa_{1-y}N$ (where $0 < y < 0.4$). The capping layer is disposed on the barrier layer. In the epitaxial substrate, a group III nitride semiconductor layer consisting of the channel layer, the barrier layer, and the capping layer has a sheet resistance value of 300 (Ω/sq.) to 800 (Ω/sq.).

In the epitaxial substrate, when a Gaussian function is fitted to a Ga 3d peak of a surface of the group III nitride semiconductor layer obtained by X-ray photoelectron spectroscopy on the surface, a ratio $(I_{GaO}/I_{GaN})$ of a GaO intensity $I_{GaO}$ to a GaN intensity $I_{GaN}$ may be 0.15 or more.

Details of Embodiments of the Present Disclosure

Specific examples of the method for manufacturing an epitaxial substrate according to the present disclosure will be described below with reference to the drawings. Note that the present invention is not limited to these examples, but is indicated by the scope of the claims, and is intended to include all modifications within the meaning and the range equivalent to the scope of the claims. In the following description, the same elements are denoted by the same reference signs in the description of the drawings, and redundant description will be omitted.

FIG. 1 illustrates a cross-sectional structure of an epitaxial substrate 10 including a group III nitride semiconductor layer 12 used for measuring a sheet resistance value. Epitaxial substrate 10 is, for example, an epitaxial wafer used for manufacturing a high electron mobility transistor (HEMT). As an example, epitaxial substrate 10 includes a substrate 11 having a flat main surface 11a and group III nitride semiconductor layer 12 epitaxially grown on main surface 11a of substrate 11. Substrate 11 may be made of any material as long as it has a lattice constant close to that of the group III nitride semiconductor. For example, SiC is used. Main surface 11a is a c-plane, but may have a slight off angle. Group III nitride semiconductor layer 12 includes a GaN channel layer 13 epitaxially grown on main surface 11a, an AlGaN barrier layer 14 epitaxially grown on GaN channel layer 13, and a GaN capping layer 15 epitaxially grown on AlGaN barrier layer 14. GaN channel layer 13 also functions as a buffer layer for increasing the crystallinity of AlGaN barrier layer 14. Further, an InGaN barrier layer may be provided instead of AlGaN barrier layer 14. The thickness of GaN channel layer 13 is, for example, from 200 nm to 1000 nm. The thickness of AlGaN barrier layer 14 is, for example, from 10 nm to 30 nm. The thickness of GaN capping layer 15 is, for example, from 1 nm to 10 nm.

Figure 2:
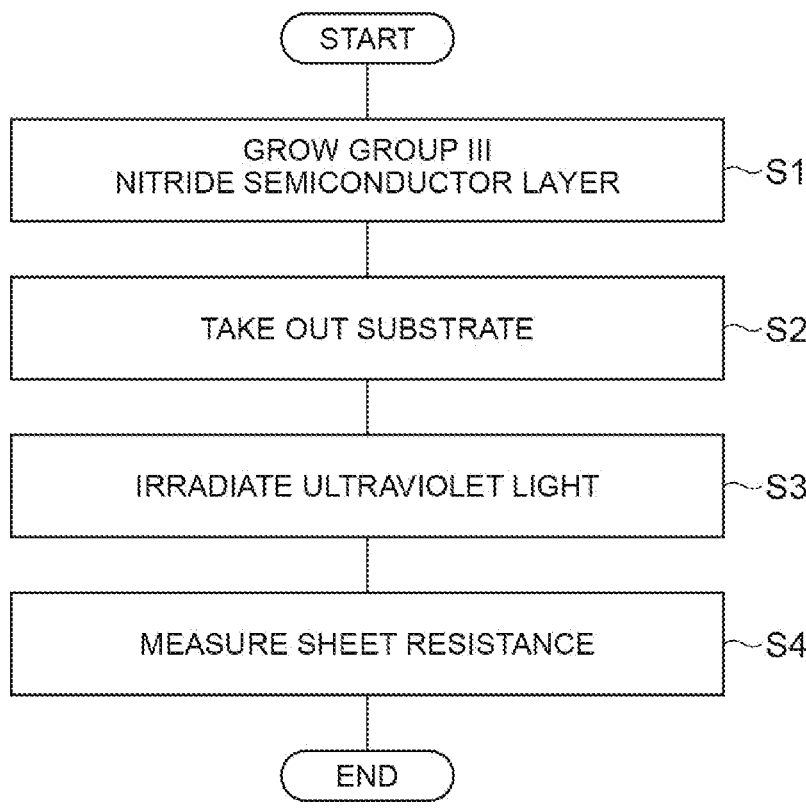
FIG. 2 is a flow chart illustrating a manufacturing method according to an embodiment.
Figure 3A:
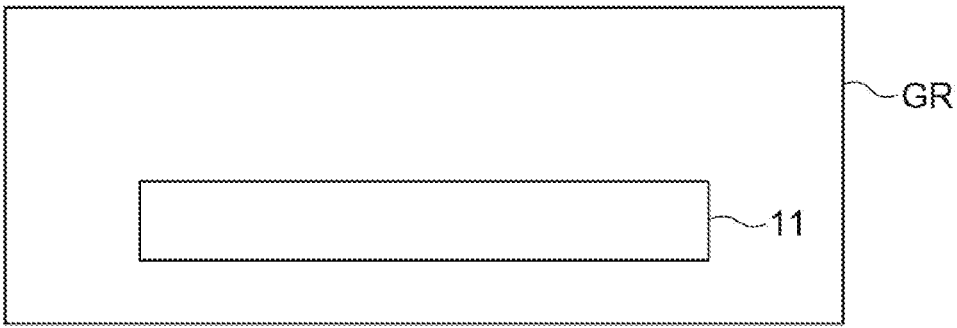
FIG. 3A is a diagram illustrating one step of the manufacturing method.
Figure 3B:
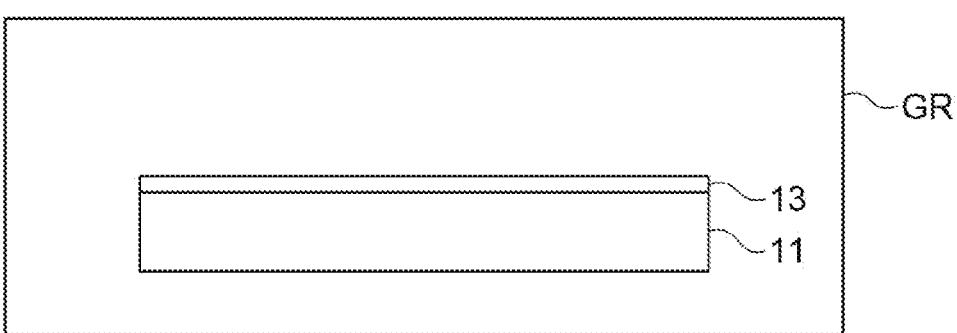
FIG. 3B is a diagram illustrating one step of the manufacturing method.
Figure 3C:
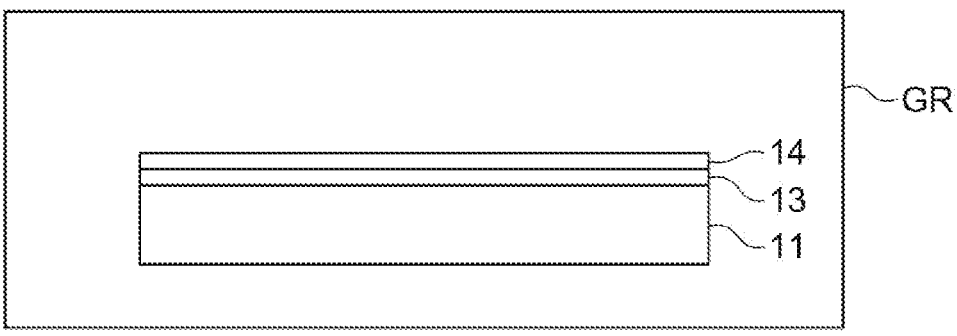
FIG. 3C is a diagram illustrating one step of the manufacturing method.
Figure 3D:
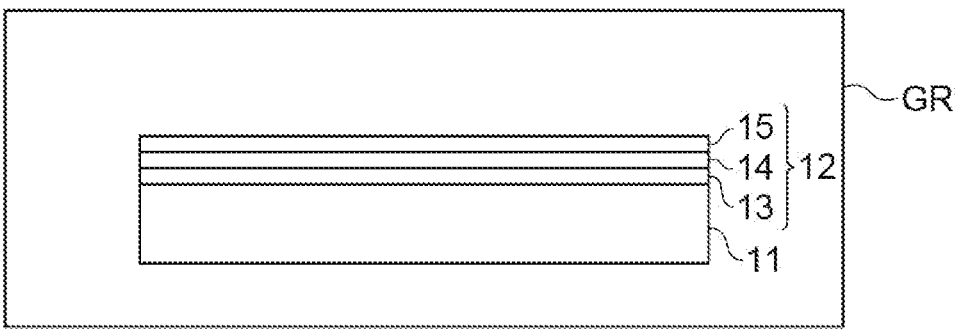
FIG. 3D is a diagram illustrating one step of the manufacturing method.

FIG. 2 is a flow chart illustrating a manufacturing method according to the present embodiment. First, in step S1, group III nitride semiconductor layer 12 is epitaxially grown on substrate 11. Specifically, as illustrated in FIG. 3A, substrate 11 is placed in a growth furnace GR. Then, trimethylgallium (TMG) gas and ammonia ($NH_3$) gas are supplied into growth furnace GR after regulating temperature and pressure in growth furnace GR. Thereby, as illustrated in FIG. 3B, GaN channel layer 13 is epitaxially grown on substrate 11. Next, the temperature and pressure in growth furnace GR are changed, and then a TMG gas, a trimethylaluminum (TMA) gas, and a $NH_3$ gas are supplied into growth furnace GR. Thereby, as illustrated in FIG. 3C, AlGaN barrier layer 14 is epitaxially grown on substrate 11. When an InGaN barrier layer is formed instead of AlGaN barrier layer 14, a trimethylindium (TMI) gas may be supplied instead of the TMA gas. Next, the temperature and pressure in growth furnace GR are changed again, and then the TMG gas and the $NH_3$ gas are supplied into growth furnace GR. Thereby, as illustrated in FIG. 3D, GaN capping layer 15 is epitaxially grown on substrate 11. In this way, group III nitride semiconductor layer 12 including GaN channel layer 13, AlGaN barrier layer 14, and GaN capping layer 15 is formed on substrate 11.

Figure 4A:
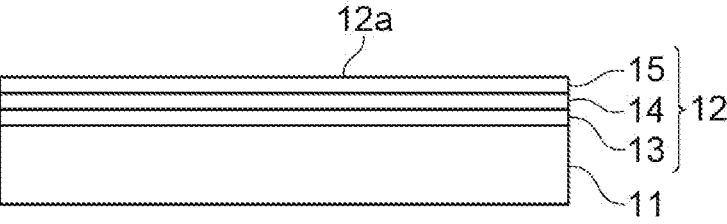
FIG. 4A is a diagram illustrating one step of the manufacturing method.

Next, in step S2, as illustrated in FIG. 4A, substrate 11 on which group III nitride semiconductor layer 12 is formed is taken out from growth furnace GR. At this time, a surface 12a of group III nitride semiconductor layer 12 is exposed to an air atmosphere containing oxygen.

Figure 4B:
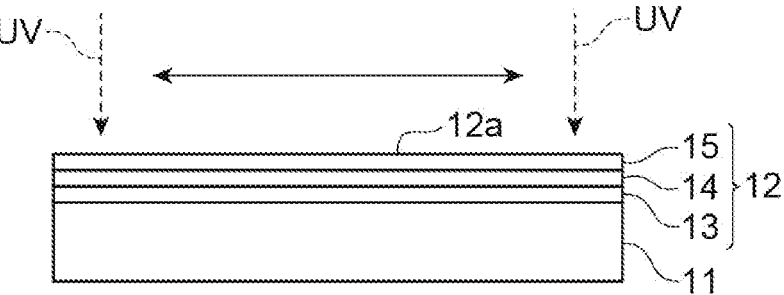
FIG. 4B is a diagram illustrating one step of the manufacturing method.

Next, in step S3, as illustrated in FIG. 4B, ultraviolet light UV is irradiated to surface 12a of group III nitride semiconductor layer 12 at room temperature and atmosphere pressure while exposing surface 12a to the atmosphere. When substrate 11 is sufficiently thin and can transmit ultraviolet light UV, ultraviolet light UV may be irradiated to surface 12a of group III nitride semiconductor layer 12 from the back surface of substrate 11.

Figure 5:
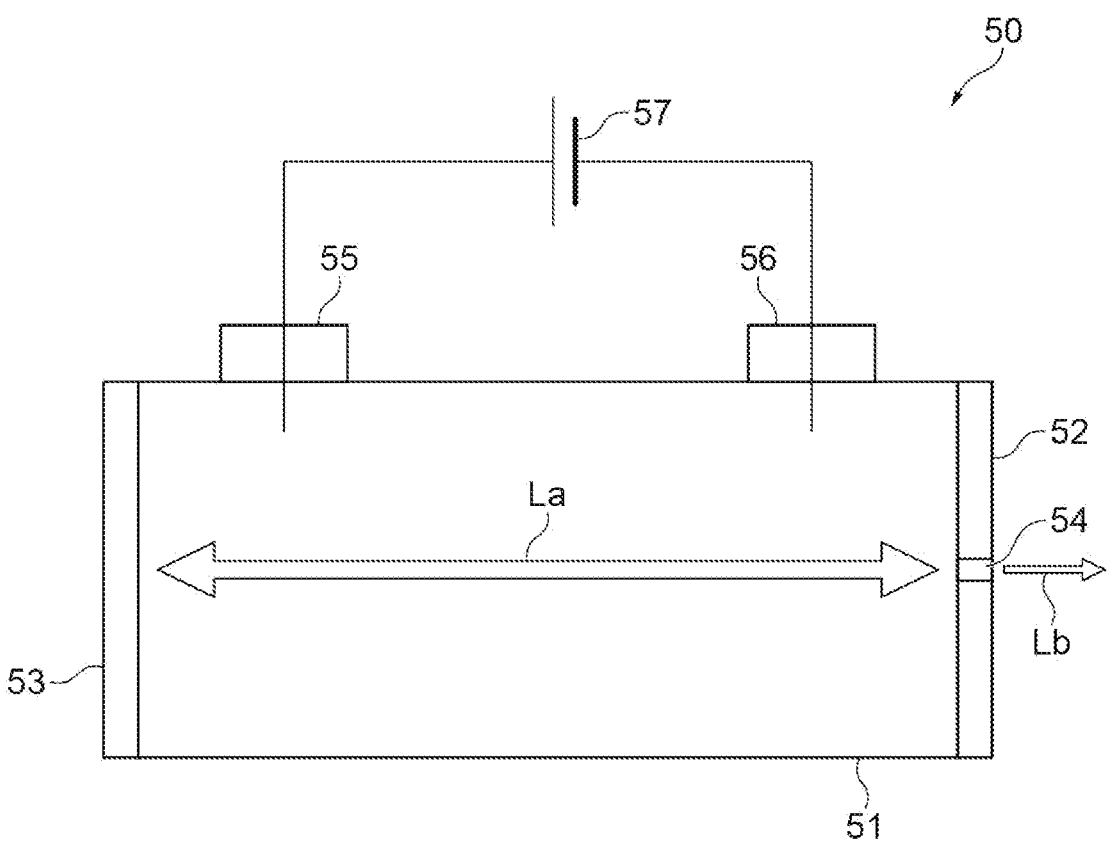
FIG. 5 is a diagram illustrating a structural example of a He—Cd laser.

Ultraviolet light UV is, for example, laser light having a single wavelength, and ultraviolet light UV in a spot shape is uniformly scanned (also referred to as swept) over the entire surface of surface 12a. The center wavelength of ultraviolet light is, for example, 200 nm or more, may be from 320 nm to 330 nm, and is, for example, 325 nm. As a source of ultraviolet light UV, for example, a helium cadmium (He—Cd) laser can be used. FIG. 5 is a diagram illustrating a structural example of a He—Cd laser. In a He—Cd laser 50 illustrated in FIG. 5, He and Cd are introduced and sealed in a gas pipe 51, and an anode 55 and a cathode 56 are provided on a side wall of gas pipe 51 so as to be separated from each other. The inside of gas pipe 51 is heated to 250° C. or higher, and He and Cd are vaporized into atoms. In this state, a voltage applied between anode 55 and cathode 56 by power supply 57 generates discharge in the gas pipe 51. At this time, atomic Cd collides with He, transit to an excited state, and returns to the ground state. At this time, light La is generated. The generated light La is laser-oscillated between a pair of mirrors 52 and 53 provided at both ends of gas pipe 51 respectively. A part of the oscillation light is extracted from a laser transmission hole 54 formed in mirror 52 and outputted as laser light Lb. The following is an example of irradiation conditions of ultraviolet light UV, but the irradiation conditions are not limited to this. For example, irradiation energy density, which is the product of the intensity of ultraviolet light and the irradiation time, may be 2.4 W·s/m$^2$ or more.

Figure 4C:
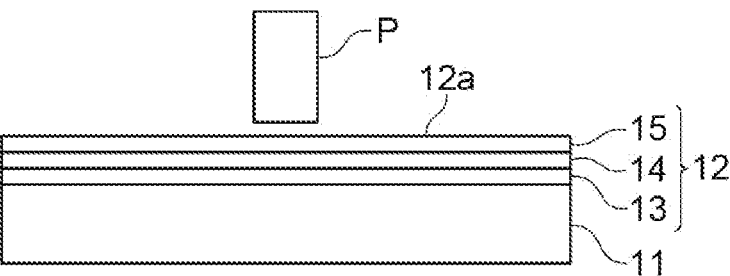
FIG. 4C is a diagram illustrating one step of the manufacturing method.

Wave length: 325 nm
Output: 2.7 mW
Irradiation time: 90 seconds
Irradiation spot size: 1 mm
Irradiation energy density: 2.4 W·s/m$^2$ The sheet resistance value of group III nitride semiconductor layer 12 is stabilized by the above irradiation of ultraviolet light UV. Subsequently, in step S4, as illustrated in FIG. 4C, the sheet resistance value of group III nitride semiconductor layer 12 is measured by a non-contact measurement method (e.g. an eddy-current method). For example, the sheet resistance value is measured within 0.2 hours after substrate 11 is taken out from growth furnace GR. Specifically, a probe P incorporating an electromagnet is brought close to surface 12a of group III nitride semiconductor layer 12 to generate an AC magnetic field penetrating group III nitride semiconductor layer 12. As a result, an eddy current is generated inside group III nitride semiconductor layer 12, and a demagnetizing field is generated. A current is generated in the coil in probe P due to the influence of the diamagnetic field, and the magnitude of the current is measured. Accordingly, the magnitude of the eddy current can be measured, and the sheet resistance value of group III nitride semiconductor layer 12 can be calculated according to a predetermined relational expression. Note that the method of measuring the sheet resistance value is not limited to this, and another method may be used.

The effects obtained by the manufacturing method of the present embodiment described above will be described. FIG.

Figure 6:
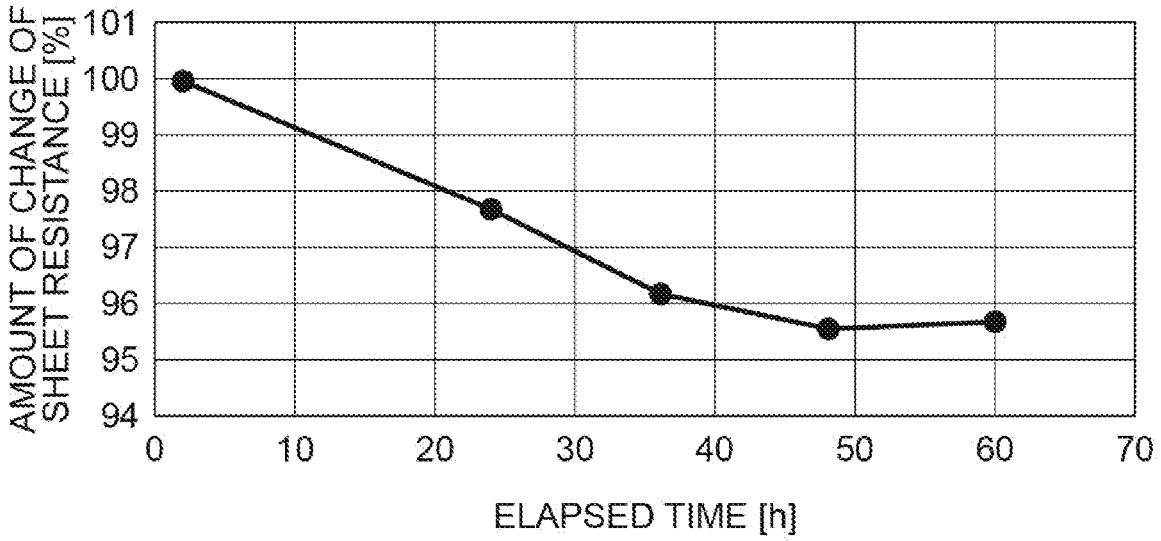
FIG. 6 is a graph illustrating an example of a change over time in the sheet resistance value of a group III nitride semiconductor layer when a substrate is taken out from a growth furnace and left as it is after the group III nitride semiconductor layer is grown.

6 is a graph illustrating an example of a change over time in the sheet resistance value of group III nitride semiconductor layer 12 when substrate 11 is taken out from growth furnace GR and left as it is after group III nitride semiconductor layer 12 is grown. In FIG. 6, the horizontal axis represents the elapsed time (unit: hour), and the vertical axis represents the ratio (unit: %) of the sheet resistance value when the sheet resistance value immediately after substrate 11 is taken out from growth furnace GR is taken as 100%. As illustrated in FIG. 6, substrate 11 is taken out from growth furnace GR, and then the sheet resistance value of group III nitride semiconductor layer 12 gradually decreases with time. After about 48 hours, the sheet resistance value is stabilized. This change in the shear resistance value is related to the degree of oxidation of surface 12a of group III nitride semiconductor layer 12.

Figure 7A:
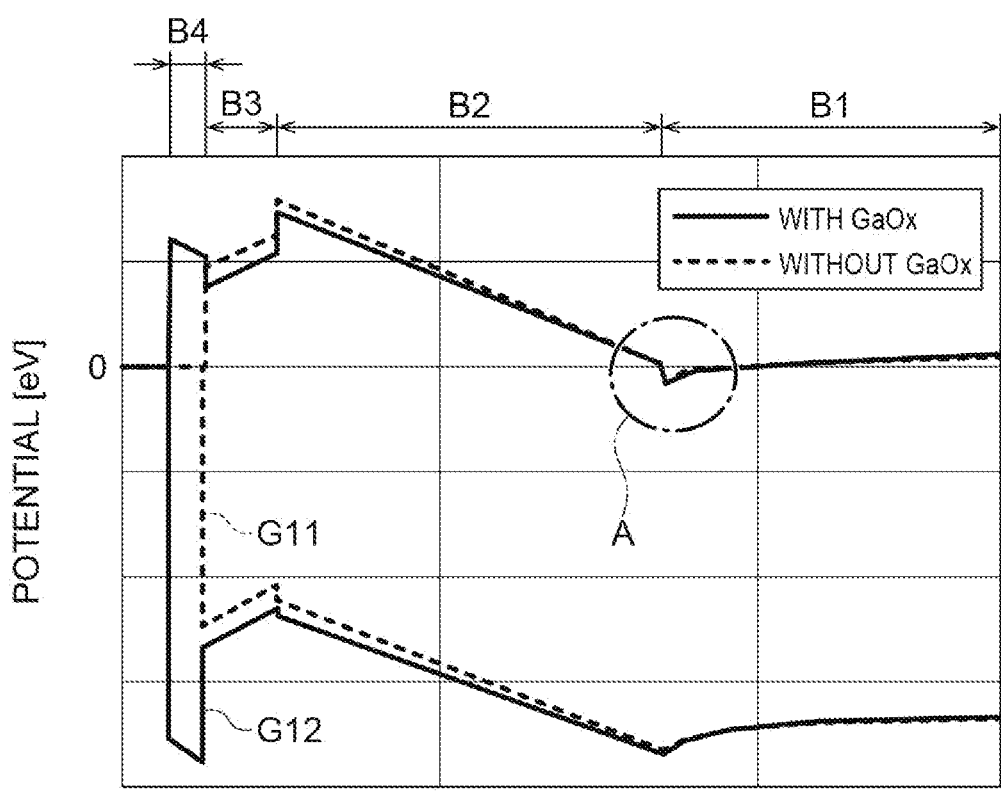
FIG. 7A is a potential schematic diagram (band diagram) of a group III nitride semiconductor layer obtained by simulation.
Figure 7B:
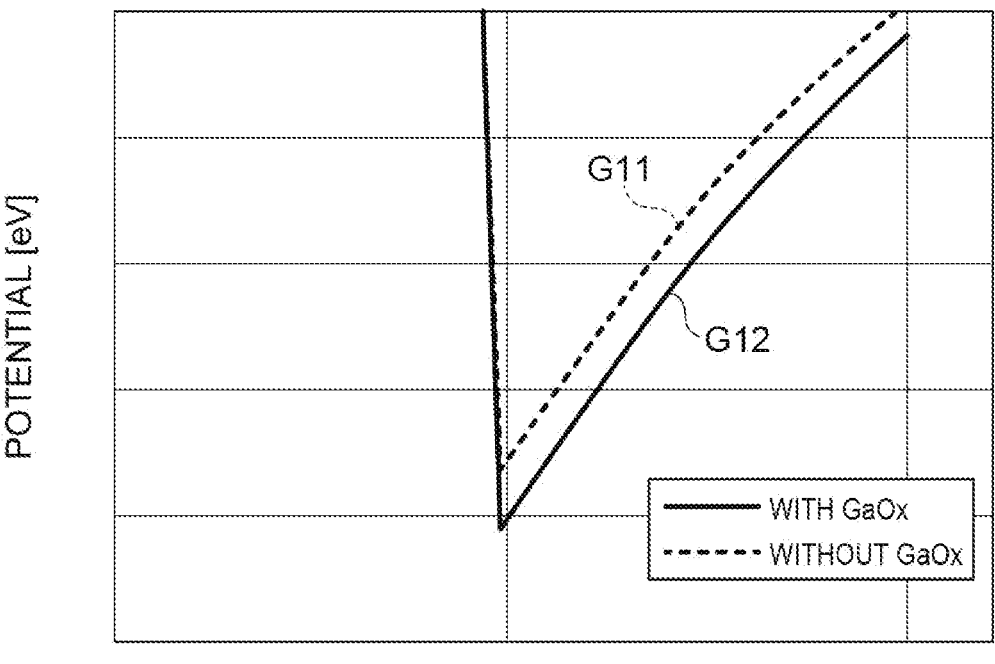
FIG. 7B is a partially enlarged view of the region A illustrated in FIG. 7A.

Here, the reason why the sheet resistance value changes depending on the degree of oxidation of surface 12a of group III nitride semiconductor layer 12 will be described. FIG. 7A is a potential schematic diagram (band diagram) of group III nitride semiconductor layer 12 obtained by simulation. In FIG. 7A, a range B1 corresponds to GaN channel layer 13, a range B2 corresponds to AlGaN barrier layer 14, a range B3 corresponds to GaN capping layer 15, and a range B4 corresponds to the surface oxide layer (GaO$_x$). A graph G11 indicates a potential before surface 12a is oxidized, and a graph G12 indicates a potential after surface 12a is sufficiently oxidized. FIG. 7B is a partially enlarged view of the region A illustrated in FIG. 7A.

As illustrated in the graph G12 of FIG. 7A, compared to before the oxidation of surface 12a (immediately after the formation of group III nitride semiconductor layer 12, graph G11), as the oxidation of surface 12a progresses (as the surface oxide film becomes thicker), the conduction band potential of group III nitride semiconductor layer 12 decreases overall. Therefore, as illustrated in FIG. 7B, the valley of the conduction band potential at the boundary between AlGaN barrier layer 14 and GaN channel layer 13 becomes deeper. As a result, the carrier density of the two dimensional electron gas generated near the interface with AlGaN barrier layer 14 in GaN channel layer 13 increases, and the sheet resistance value decreases. For this reason, the sheet resistance value decreases as the oxidation of surface 12a progresses.

Figure 8A:
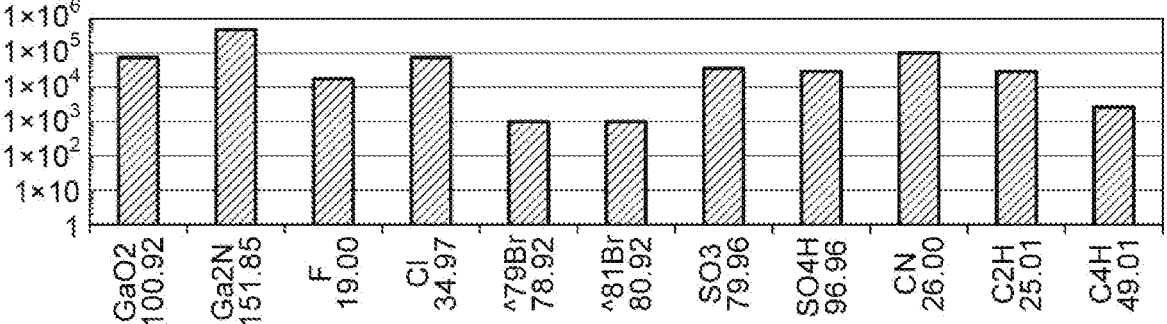
FIG. 8A illustrates the results of analyzing and counting negative ions present on a surface of a group III nitride semiconductor layer.
Figure 8B:
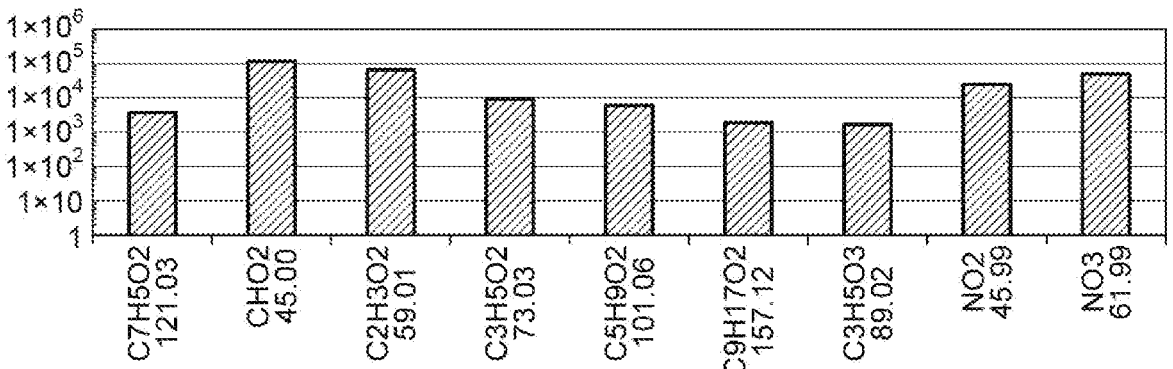
FIG. 8B illustrates the results of analyzing and counting negative ions present on the surface of the group III nitride semiconductor layer.
Figure 8C:
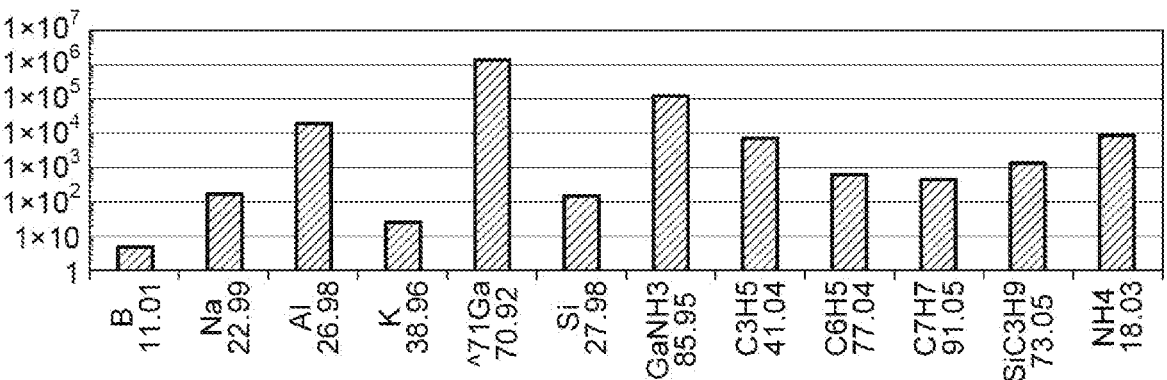
FIG. 8C illustrates the results of analyzing and counting positive ions present on the surface of the group III nitride semiconductor layer.

It is considered that the oxidation of surface 12a takes time for the following reason. When substrate 11 is taken out of growth furnace GR after group III nitride semiconductor layer 12 is formed, surface 12a is exposed to the air atmosphere, and various substances (e.g. hydrocarbon, halogen, sulfur oxide, and nitrogen carbide) contained in the air are physically adsorbed on surface 12a. At this time, these substances are bonded to the group III atom (Ga) of surface 12a and inhibit the bonding between the group III atom (Ga) and the oxygen atom. FIGS. 8A and 8B illustrate results obtained by analyzing and counting negative ions present on surface 12a, and FIG. 8C illustrates results obtained by analyzing and counting positive ions present on surface 12a. In FIGS. 8A to 8C, the vertical axis represents the number of ions, and the horizontal axis represents atomic weight or molecular weight. It is thought that the bonds between these substances and the group III atoms mainly arise from intermolecular forces. Since these bonds are more unstable than the covalent bonds between the group III atoms and oxygen, these substances gradually replace oxygen atoms. Through such a process, it takes a long time to oxidize surface 12a.

In the conventional measurement method, substrate 11 is taken out from growth furnace GR and then substrate 11 is left in the atmosphere as it is, pending until the substances of surface 12a are replaced with oxygen atoms and sufficiently oxidized, and after that, measurement of the sheet resistance value is performed. However, this method requires a long time until surface 12a is sufficiently oxidized (e.g. about 48 hours), and thus the production lead time is prolonged and the production efficiency is reduced. The method also requires to measure the sheet resistance value a plurality of times before the sheet resistance value is stabilized, which leads to an increase in manufacturing man-hours.

To solve this problem, in the present embodiment, substrate 11 on which group III nitride semiconductor layer 12 is formed is taken out from growth furnace GR, and then surface 12a of group III nitride semiconductor layer 12 is irradiated with ultraviolet light UV while surface 12a is exposed to the atmosphere. According to the findings of the present inventors, when surface 12a of group III nitride semiconductor layer 12 is irradiated with ultraviolet light UV while surface 12a is exposed to the atmosphere, oxidation of surface 12a is significantly accelerated as compared with a case where surface 12a is left exposed to the atmosphere.

Figure 9A:
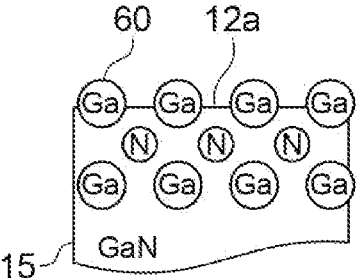
FIG. 9A is a diagram for explaining the reason why oxidation of a surface of a group III nitride semiconductor layer is accelerated by irradiation with ultraviolet light UV.
Figure 9B:
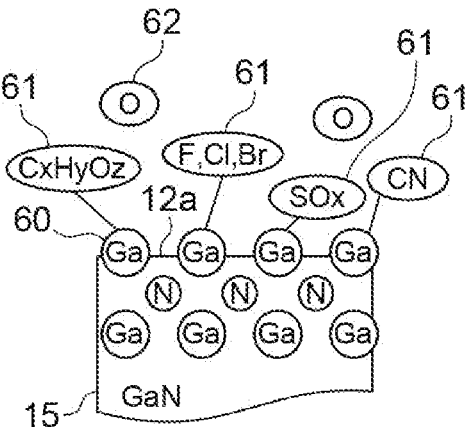
FIG. 9B is a diagram for explaining the reason why oxidation of the surface of the group III nitride semiconductor layer is accelerated by irradiation with ultraviolet light UV.
Figure 9C:
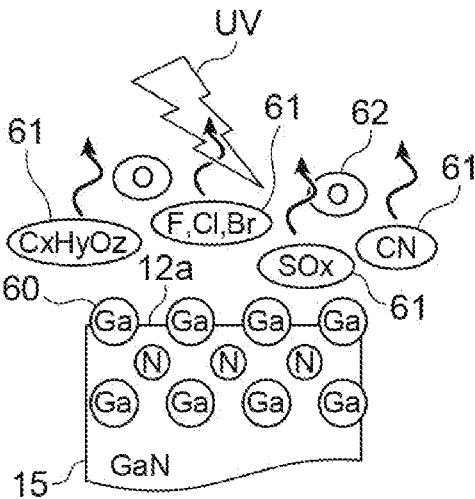
FIG. 9C is a diagram for explaining the reason why oxidation of the surface of the group III nitride semiconductor layer is accelerated by irradiation with ultraviolet light UV.
Figure 9D:
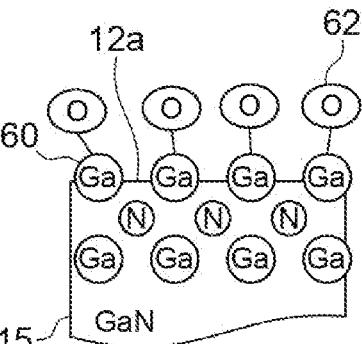
FIG. 9D is a diagram for explaining the reason why oxidation of the surface of the group III nitride semiconductor layer is accelerated by irradiation with ultraviolet light UV.

FIGS. 9A to 9D are diagrams for explaining the reason why the oxidation of surface 12a is accelerated by irradiation with ultraviolet light UV. FIG. 9A illustrates a state immediately after group III nitride semiconductor layer 12 is formed. FIG. 9A illustrates GaN capping layer 15, which is the uppermost layer of group III nitride semiconductor layer 12, and the surface of GaN capping layer 15 (i. e., surface 12a of group III nitride semiconductor layer 12). When substrate 11 is taken out from growth furnace GR, as illustrated in FIG. 9B, various substances 61 such as hydrocarbon, halogen, sulfur oxide, and nitrogen carbide are bonded to group III atoms (in this example, Ga atoms) 60 of surface 12a to inhibit the bonding between a group III atom 60 and an oxygen atom 62. Thus, as illustrated in FIG. 9C, when surface 12a is irradiated with ultraviolet light UV, surface 12a generates heat. The bonding between each substance 61 and group III atom 60 is broken by this heat. Alternatively, each substance 61 is oxidized and changed into a low-density substance. By these actions, each substance 61 is desorbed from group III nitride semiconductor layer 12. Immediately, oxygen atom 62 in the atmosphere is bonded to group III atom 60 of surface 12a, and group III atom 60 is oxidized (FIG. 9D). In this way, oxidation of surface 12a is accelerated, and the sheet resistance value can be stabilized in a shorter time. Therefore, according to the present embodiment, it is possible to shorten the production lead time and improve the production efficiency. After that, by growing an insulating film on the Ga surface, it is possible to suppress the variation of the stable sheet resistance value. The insulating film can be grown by Chemical Vapor Deposition (CVD). For example, the insulating film may be any one of a silicon nitride film, a silicon oxide film, and a silicon nitride oxide film formed by a growth method such as P-CVD, ALD-CVD, thermal CVD, or LP-CVD.

Figure 10:
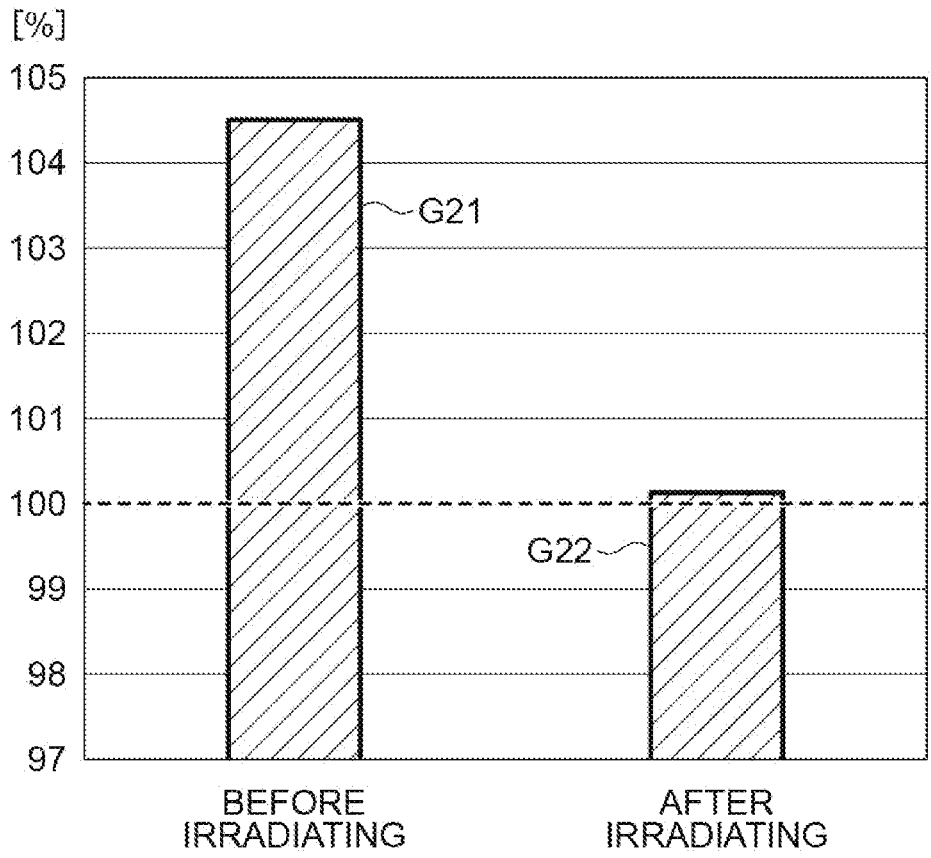
FIG. 10 is a graph illustrating the ratio of the sheet resistance value with reference to the sheet resistance value (100%) after 48 hours have passed since the substrate on which the group III nitride semiconductor layer was formed was taken out from the growth furnace.

FIG. 10 is a graph illustrating the ratio of a sheet resistance value with reference to the sheet resistance value (100%) after 48 hours have passed since substrate 11 on which group III nitride semiconductor layer 12 was formed was taken out from growth furnace GR. In FIG. 10, a graph G21 illustrates a sheet resistance value immediately after being taken out from growth furnace GR and before being irradiated with ultraviolet light UV. Graph G22 illustrates a sheet resistance value after ultraviolet light UV irradiation. The irradiation conditions were, wave length: 325 nm, output: 2.7 mW, irradiation time: 90 seconds, irradiation spot size: 1 mm, and irradiation energy density: 2.4 W·s/m$^2$. Referring to FIG. 10, immediately after being taken out from growth furnace GR, the sheet resistance value before being irradiated with ultraviolet light UV exceeds 104%. On the other hand, it can be seen that the sheet resistance value after ultraviolet light UV irradiation is extremely close to 100%, and is almost the same as the sheet resistance value after 48 hours (that is, a state in which oxidation has sufficiently progressed). The above effect was confirmed by the results of this experiment. Even when ultraviolet light UV having a center wavelength lower than 325 nm, which has higher energy, is irradiated, it is considered that equivalent or better effect can be obtained. It is also considered that equivalent effect can be obtained even when the wavelength is 422 nm or less, which is the wavelength of the He—Cd laser light.

After the above experiment, a sample of group III nitride semiconductor layer 12 whose sheet resistance value was stabilized (48 hours later) was analyzed with X-ray photo-electron spectroscopy (XPS), and a Ga3d peak obtained by the analysis was fitted by a Gaussian function. As a result, a ratio ($I_{GaO}/I_{GaN}$) of a GaO intensity $I_{GaO}$ to a GaN intensity $I_{GaN}$ was 0.15. Therefore, in order to stabilize the sheet resistance value, ($I_{GaO}/I_{GaN}$) of the surface oxide layer (GaO$_x$) is preferably 0.15 or more. According to the measurement method of the present embodiment, the degree of oxidation ($I_{GaO}/I_{GaN}$) of group III nitride semiconductor layer 12 can be accelerated to the same degree (0.15) or more in a short time.

As described above, group III nitride semiconductor layer 12 may include Ga in surface 12a. In this case, upon irradiating ultraviolet light to the surface of the group III nitride semiconductor layer, Ga is changed to GaO$_x$ due to bonding of an oxygen atom to a Ga atom. Therefore, oxidation of surface 12a is accelerated, and the sheet resistance value can be stabilized in a shorter time.

As described above, the sheet resistance value of group III nitride semiconductor layer 12 may be measured within 0.2 hours after substrate 11 is taken out from growth furnace GR. According to the present embodiment, the sheet resistance value can be measured within such an extremely short time after substrate 11 is taken out from growth furnace GR, which can contribute to an improvement in production efficiency.

As described above, the center wavelength of ultraviolet light UV may be 325 nm or less. In this case, the strong energy of ultraviolet light UV breaks the bonding between various substances 61 and group III atoms 60 more quickly and can accelerate the oxidation of surface 12a of group III nitride semiconductor layer 12 more effectively. The ultraviolet light may be, for example, He—Cd laser light. In this case, ultraviolet light UV light having the center wavelength in a range from 190 nm to 422 nm can be emitted. As described above, it is considered that the equivalent effect can be obtained even when the center wavelength of ultraviolet light UV is 422 nm or less, which is the wave length of He—Cd laser light.

In addition, the sheet resistance value of group III nitride semiconductor layer 12 having a stable sheet resistance value may be, for example, from 300 (Ω/sq.) to 800 (Ω/sq.).

The method for manufacturing an epitaxial substrate according to the present disclosure is not limited to the above-described embodiments, and various other modifications are possible. For example, although the method of the present disclosure is applied to a substrate product used for manufacturing a GaN-based HEMT in the above-described embodiment, the method of the present disclosure is not limited thereto and can be applied to substrate products having group III nitride semiconductor layers of various applications and configurations. In addition, although the group III nitride semiconductor layer is exposed to the air atmosphere when ultraviolet light is irradiated in the above embodiment, the group III nitride semiconductor layer may be exposed to another atmosphere as long as the atmosphere contains oxygen. In addition, although ultraviolet light is irradiated to the group III nitride semiconductor layer whose surface is GaN in the above embodiment, the surface of the group III nitride semiconductor layer may be made of other group III nitride semiconductors such as AlGaN and InGaN.

REFERENCE SIGNS LIST 10 epitaxial substrate
11 substrate
11 a main surface
12 group III nitride semiconductor layer
12a surface
13 GaN channel layer
14 AlGaN barrier layer
15 GaN capping layer
50 He—Cd laser
51 gas pipe
52, 53 mirror
54 laser transmission hole
55 anode
56 cathode
57 power supply
60 group III atom
61 substance
62 oxygen atom
B1, B2, B3, B4 range
GR growth furnace
La light
Lb laser light
P probe
UV ultraviolet light
The invention claimed is:

1. A method for manufacturing an epitaxial substrate, comprising:
   epitaxially growing a group III nitride semiconductor layer on a substrate;
   removing the substrate from a growth furnace;
   irradiating a surface of the group III nitride semiconductor layer with He—Cd laser light having a center wavelength of 325 nm±5 nm while exposing the surface to an atmosphere containing oxygen, thereby promoting oxidation of surface Ga to form a Ga oxide layer having a GaO to GaN intensity ratio ($I_{GaO}/I_{GaN}$) of 0.15 or more, as determined, after the irradiating, by fitting a Gaussian function to a Ga 3d peak obtained by X-ray photoelectron spectroscopy; and
   measuring a sheet resistance value of the group III nitride semiconductor layer,
   wherein the sheet resistance value is measured within 0.2 hours after the substrate is removed from the growth furnace,
   wherein an irradiation energy density of the He—Cd laser light is 2.4 W·s/m$^2$ or more, and
   wherein the surface of the group III nitride semiconductor layer contains Ga.

2. The method for manufacturing an epitaxial substrate according to claim 1, wherein the irradiation energy density in the step of irradiating the surface with the He—Cd laser light is 2.4 W s/m$^2$ or more, the irradiation energy density being a product of an intensity and an irradiation time of the ultraviolet light.

3. The method for manufacturing an epitaxial substrate according to claim 1, further comprising a step of forming an insulating film on a Ga surface of the group III nitride semiconductor layer.

4. The method of claim 1, wherein the group III nitride semiconductor layer consists of a channel layer, a barrier layer Al$_y$Ga$_{1-y}$N (0<y<0.4), and a capping layer.

5. The method of claim 1, wherein the measured sheet resistance value is 300 Ω/sq to 800 Ω/sq.

6. A method for manufacturing an epitaxial substrate, comprising:

epitaxially growing a group III nitride semiconductor layer on a substrate;

removing the substrate from a growth furnace;

irradiating a surface of the group III nitride semiconductor layer with ultraviolet light while exposing the surface to an atmosphere containing oxygen, wherein the ultraviolet light irradiation promotes oxidation of surface Ga to form a Ga oxide layer having a GaO to GaN intensity ratio (I$_{Gao}$/I$_{GaN}$) of 0.15 or more, as determined by fitting a Gaussian function to a Ga 3d peak obtained by X-ray photoelectron spectroscopy; and measuring a sheet resistance value of the group III nitride semiconductor layer, wherein the sheet resistance value is measured within 0.2 hours after the substrate is removed from the growth furnace, and wherein the surface of the group III nitride semiconductor layer contains Ga, and wherein the ultraviolet light has a center wavelength of 325 nm to 422 nm.

7. The method for manufacturing an epitaxial substrate according to claim 6, wherein the ultraviolet light is He—Cd laser light.

* * * * *